(12) United States Patent
Lu (10) Patent No.: US 11,856,754 B2
(45) Date of Patent: Dec. 26, 2023

(54) METHOD OF MANUFACTURING SEMICONDUCTOR STRUCTURE, SEMICONDUCTOR STRUCTURE, AND MEMORY

(71) Applicant: CHANGXIN MEMORY TECHNOLOGIES, INC., Hefei (CN)

(72) Inventor: Jingwen Lu, Hefei (CN)

(73) Assignee: Changxin Memory Technologies, Inc., Anhui (CN)

( * ) Notice: Subject to any disclaimer, the term of this patent is extended or adjusted under 35 U.S.C. 154(b) by 0 days.

(21) Appl. No.: 18/363,819

(22) Filed: Aug. 2, 2023

(65) Prior Publication Data

US 2023/0389295 A1 Nov. 30, 2023

Related U.S. Application Data

(63) Continuation of application No. PCT/CN2022/087125, filed on Apr. 15, 2022.

(30) Foreign Application Priority Data

Jan. 6, 2022 (CN) .......................... 202210010116.8

(51) Int. Cl.
H10B 12/00 (2023.01)
(52) U.S. Cl.
CPC .......... *H10B 12/34* (2023.02); *H10B 12/053* (2023.02)
(58) Field of Classification Search
None
See application file for complete search history.

(56) References Cited

U.S. PATENT DOCUMENTS

| 11,158,639 | B2 | 10/2021 | Zhu et al. |
| 2018/0286742 | A1* | 10/2018 | Nagai ............... H01L 21/76224 |

FOREIGN PATENT DOCUMENTS

| CN | 105097641 A | 11/2015 |
| CN | 107240586 A | 10/2017 |
| CN | 107680969 A | 2/2018 |
| CN | 108807282 A | 11/2018 |

OTHER PUBLICATIONS

International Search Report cited in PCT/CN2022/087125 dated Jun. 29, 2022, 17 pages.

* cited by examiner

*Primary Examiner* — Hsien Ming Lee
(74) *Attorney, Agent, or Firm* — Cooper Legal Group, LLC (57) ABSTRACT

The present disclosure provides a method of manufacturing a semiconductor structure, a semiconductor structure, and a memory. The semiconductor structure includes a base. The base includes columnar basal bodies and an isolation layer filled around the columnar basal bodies. Word line trenches are provided in the base and extend along a direction parallel to a surface of the base. First trench portions are formed at parts of the word line trenches intersecting with the columnar basal bodies, and a first word line conductive layer, a second word line conductive layer, and an insulating layer are sequentially arranged in the first trench portions from bottom to top. Second trench portions are formed at parts of the word line trenches intersecting with the isolation layer, and the second word line conductive layer and the insulating layer are sequentially arranged in the second trench portions from bottom to top.

15 Claims, 9 Drawing Sheets

METHOD OF MANUFACTURING SEMICONDUCTOR STRUCTURE, SEMICONDUCTOR STRUCTURE, AND MEMORY

CROSS-REFERENCE TO RELATED APPLICATIONS

This is a continuation of International Application No. PCT/CN2022/087125, filed on Apr. 15, 2022, which claims the priority to Chinese Patent Application 202210010116.8, titled "SEMICONDUCTOR STRUCTURE AND MANUFACTURING METHOD THEREOF" and filed on Jan. 6, 2022. The entire contents of International Application No. PCT/CN2022/087125 and Chinese Patent Application 202210010116.8 are incorporated herein by reference.

TECHNICAL FIELD

The present disclosure relates to, but is not limited to, a method of manufacturing a semiconductor structure, a semiconductor structure, and a memory.

BACKGROUND

A dynamic random access memory (DRAM) is a relatively common system memory. Each DRAM cell of includes a transistor and a corresponding capacitor, and the amount of charges stored in the capacitor is used to represent 0 and 1. To avoid data errors caused by electric leakage, the capacitor needs to be refreshed periodically. To improve the integration level of the DRAM to speed up the operation speed of each memory cell, and to meet the strong demands for the DRAM from PCs, smart phones, tablets and other markets, a buried word line DRAM structure has been developed in recent years to meet the above demands.

In the related art, a row in a memory matrix is activated, and when it is repeatedly refreshed, noise or interference may be generated to adjacent rows, thereby causing data errors in one or more cells in the adjacent rows. This phenomenon is called the so-called row hammer effect.

SUMMARY

An overview of the subject matter detailed in the present disclosure is provided below, which is not intended to limit the protection scope of the claims.

The present disclosure provides a method of manufacturing a semiconductor structure, a semiconductor structure, and a memory.

According to a first aspect of embodiments of the present disclosure, a semiconductor structure is provided. The semiconductor structure includes: a base including columnar basal bodies and an isolation layer filled around the columnar basal bodies, where word line trenches are provided in the base and extend along a direction parallel to a surface of the base;

first trench portions are formed at parts of the word line trenches intersecting with the columnar basal bodies, and a first word line conductive layer, a second word line conductive layer, and an insulating layer are sequentially arranged in the first trench portions from bottom to top; and second trench portions are formed at parts of the word line trenches intersecting with the isolation layer, and the second word line conductive layer and the insulating layer are sequentially arranged in the second trench portions from bottom to top.

According to a second aspect of the embodiments of the present disclosure, a method of manufacturing a semiconductor structure is provided. The method includes:

etching a semiconductor substrate to form initial word line trenches, and forming an first word line conductive layer in the initial word line trenches;

downwards etching the semiconductor substrate and the first word line conductive layer, and forming a plurality of columnar basal bodies, the columnar basal bodies being deeper than the first word line conductive layer, and retained parts of the initial word line trenches in the columnar basal bodies being first trench portions;

filling an isolation layer around the columnar basal bodies;

etching the first word line conductive layer and the isolation layer to form second trench portions in the isolation layer, where the first trench portions are communicated with the second trench portions to form word line trenches, and bottoms of the second trench portions are higher than bottoms of the first trench portions; and depositing a second word line conductive layer and an insulating layer in the word line trenches.

According to a third aspect of the embodiments of the present disclosure, a memory is provided. The memory includes the semiconductor structure as described in the first aspect.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

FIG. 2b is a cross-sectional view taken along an AA' direction of FIG. 2a.

FIG. 2c is a cross-sectional view taken along a BB' direction of FIG. 2a.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

To further describe the technical solutions of the present disclosure in detail, the reasons why the row hammer effect is generated are specifically explained first.

Figure 1A:
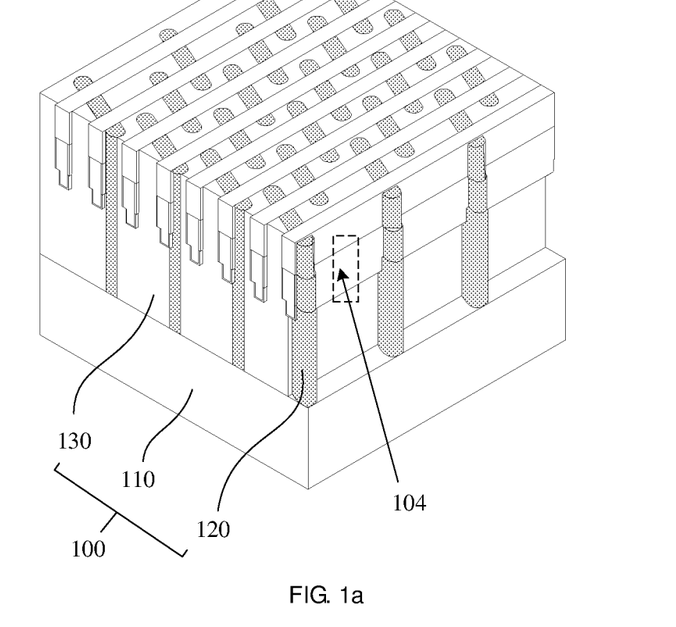
FIG. 1a is a three-dimensional structure diagram of a buried word line in a memory.

As shown in FIG. 1a, a base 100 structure of an existing memory includes a substrate layer 110, columnar basal bodies 120, and an isolation layer 130. The columnar basal bodies 120 are perpendicular to the substrate layer 110, and the isolation layer 130 is filled around the columnar basal bodies 120. The columnar basal bodies 120 are active areas (AAs) of the memory.

Figure 1B:
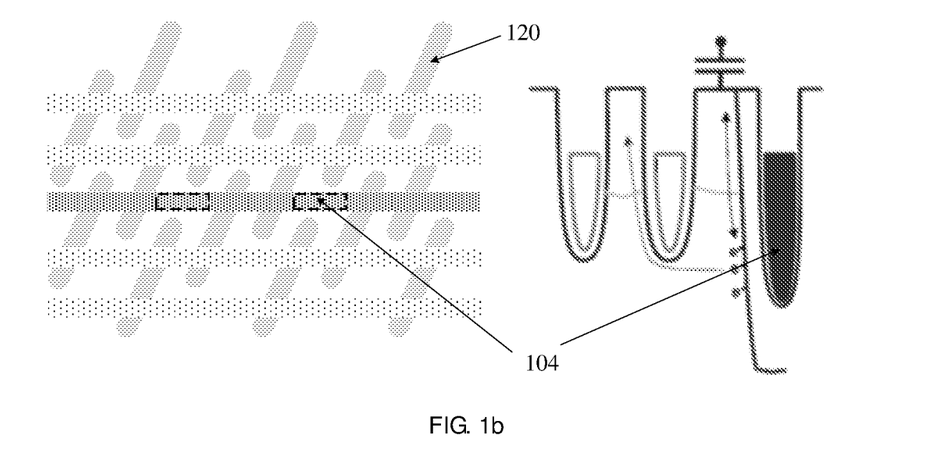
FIG. 1b is a schematic cross-sectional diagram of FIG. 1a in a horizontal direction and a cross-sectional view of an extension direction of an active area.

The buried word line (BWL) is provided in a base 100. It can be seen from FIG. 1a that the word line is continuous between different AAs. At a position marked by a dotted line box in the figure, the word line at this part is called passing word line (PWL). As shown in FIG. 1b, due to the existence of the PWL 104, electrons can easily pass through the PWL 104 from one memory cell to reach adjacent memory cells, thereby generating a row hammer effect.

The present disclosure provides a method of manufacturing a semiconductor structure, a semiconductor structure, and a memory, thereby weakening the row hammer effect caused by electron migration.

The method of manufacturing a semiconductor structure, the semiconductor structure, and the memory of the present disclosure are further described below in detail with reference to the accompanying drawings and specific embodiments. According to the following descriptions, the advantages and features of the present disclosure will become clearer. It should be noted that the drawings are simplified and do not use an accurate proportion, that is, the drawings are merely for the objectives of conveniently and clearly assisting in illustrating embodiments of the present disclosure. It should be understood that in the following descriptions, references to "on" and "under" each layer may be made based on the accompanying drawings. However, it should be understood that the spatially relative terms are intended to encompass different orientations of the components in use or operation in addition to those shown in the drawings. For example, if devices in the accompanying drawings are turned over or positioned differently (e.g., rotated), the exemplary term "on" may also include "under" and other orientational relationships. When a layer, area, pattern or structure is referred to as being "on" a substrate, layer, area and/or pattern, it can be directly on another layer or substrate, and/or intervening layers may also be present. Similarly, when a layer is referred to as being "under" another layer, it can be directly under the other layer, or there may be one or more intervening layers.

Figure 2A:
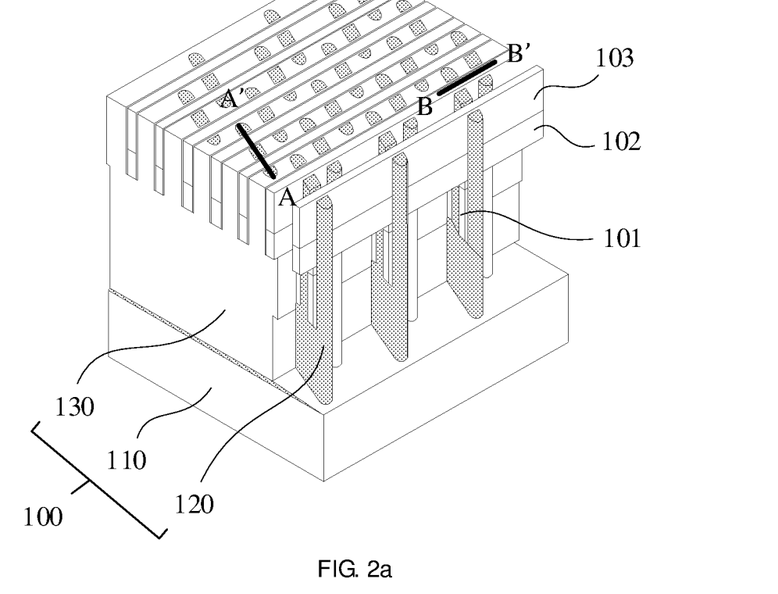
FIG. 2a is a schematic diagram of a semiconductor structure according to embodiments of the present disclosure.

FIG. 2a is a schematic diagram of a semiconductor structure according to an exemplary embodiment. The structure includes a base 100. The base 100 includes columnar basal bodies 120 and an isolation layer 130 filled around the columnar basal bodies 120. Word line trenches are provided in the base 100 and extend along a direction parallel to a surface of the base 100.

Figure 2B:
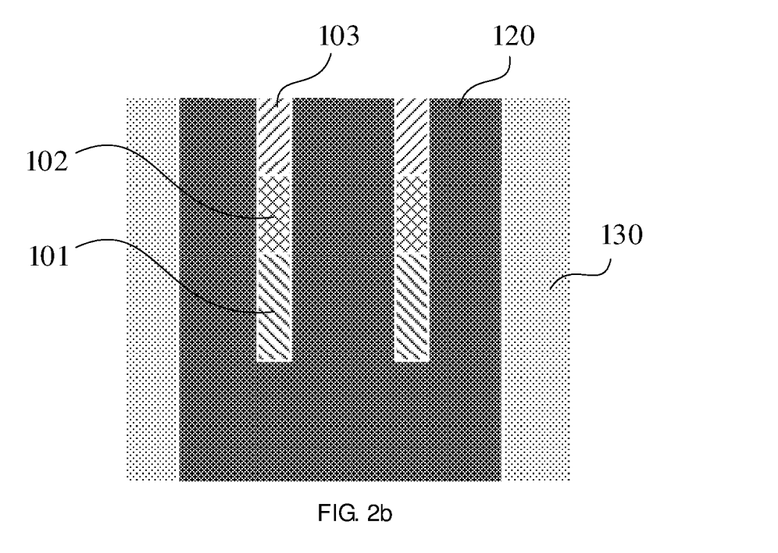
Figure 2C:
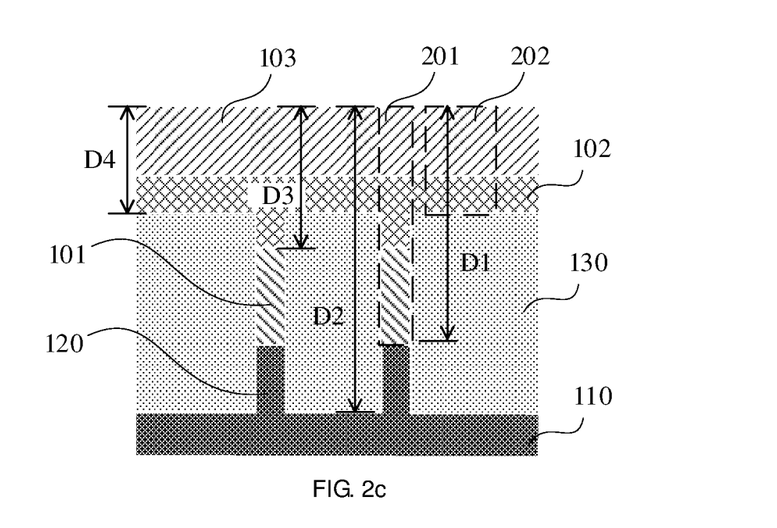

As shown in FIG. 2c, first trench portions 201 are formed at parts of the word line trenches intersecting with the columnar basal bodies 120, and a first word line conductive layer 101, a second word line conductive layer 102, and an insulating layer 103 are sequentially arranged in the first trench portions 201 from bottom to top. Second trench portions 202 are formed at parts of the word line trenches intersecting with the isolation layer 130, and the second word line conductive layer 102 and the insulating layer 103 are sequentially arranged in the second trench portions 202 from bottom to top.

In the semiconductor structure of the present disclosure, the first word line conductive layer 101 only exists in the AAs (the columnar basal bodies 120), but not in the isolation layer 130. The first word line conductive layer 101 in different AAs is connected through the second word line conductive layer 102. Such a structure separates the adjacent memory cells by the filled isolation layer 130, such that it is difficult for the electrons to migrate from one memory cell to the adjacent memory cells, thereby weakening the row hammer effect caused by the electron migration.

As shown in FIG. 2c, in some embodiments, depths D1 of the first trench portions 201 are greater than depths D4 of the second trench portions 202. Top end surface of the first word line conductive layer 101 in the first trench portions 201 is lower than bottom end surfaces of the second trench portions 202. That is, D3>D4. For example, D4 is about one-half D1 (D4=1/2×D1), and D3 is about two-thirds D1 (D3=2/3×D1).

In some embodiments, the columnar basal bodies may be made of silicon (Si); and the isolation layer may be made of silicon oxide (SiO).

In some embodiments, the first word line conductive layer 101 may be made of a metal or a metal compound, and may be, for example, one of titanium nitride (TiN) and tungsten (W) or a combination of the two. The second word line conductive layer 102 may be made of a semiconductor material, and may be, for example, doped polysilicon. The insulating layer 103 may be made of silicon nitride (SiN). It should be noted that the second word line conductive layer 102 (polysilicon) is also a part of the word line. The polysilicon has a lower work function, which can reduce gate-induced drain leakage (GIDL).

Figure 3:
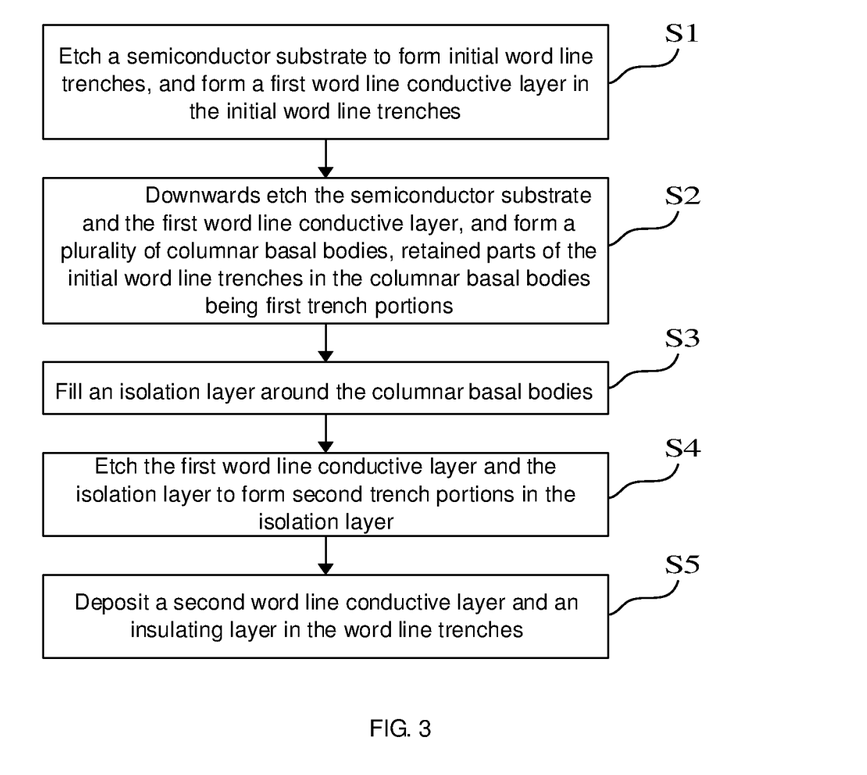
FIG. 3 is a flowchart of a method of manufacturing a semiconductor structure according to embodiments of the present disclosure.

FIG. 3 is a flowchart of a method of manufacturing a semiconductor structure according to an exemplary embodiment. The method includes the following steps.

Step S1: etch a semiconductor substrate to form initial word line trenches, and form a first word line conductive layer in the initial word line trenches.

Step S2: downwards etch the semiconductor substrate and the first word line conductive layer, and form a plurality of columnar basal bodies, the columnar basal bodies being deeper than the first word line conductive layer, and retained parts of the initial word line trenches in the columnar basal bodies being first trench portions.

With reference to FIG. 2c, the depths of the columnar basal bodies are D2, and at this time, the depth of the first word line conductive layer is D1, where D2>D1. In this way, it is ensured that the parts of the first word line conductive layer 101 intersecting with the columnar basal bodies 120 are retained, and the parts of the first word line conductive layer 101 intersecting with the isolation layer 130 are all etched. At this time, the retained parts of the initial word line trenches are the first trench portions 201.

Step S3: fill an isolation layer around the columnar basal bodies.

Step S4: etch the first word line conductive layer and the isolation layer to form second trench portions in the isolation layer, where the first trench portions are communicated with the second trench portions to form word line trenches, and bottoms of the second trench portions are higher than bottoms of the first trench portions. The etching depth of the first word line conductive layer is D3, and the etching depth of the isolation layer is D4.

With reference to FIG. 2c, the etched parts in the isolation layer 130 at this time are the second trench portions 202. D4≤D3<D1, such that the retained bottom parts of the first trench portions 201 are the first word line conductive layer 101, and the bottoms of the second trench portions 202 are not lower than the top of the first word line conductive layer 101.

Step S5: deposit a second word line conductive layer and an insulating layer in the word line trenches.

As shown in FIG. 2c, after Step S5 is completed, the first word line conductive layer 101, the second word line conductive layer 102, and the insulating layer 103 are sequentially arranged in the first trench portions 201 from bottom to top, and the second word line conductive layer 102 and the insulating layer 103 are sequentially arranged in the second trench portions 202 from bottom to top.

The method of the present disclosure is to first prepare the word line (WL) and then prepare the AAs. The finally formed BWL includes two parts: the word line located in the AAs, and the PWL of the isolation layer located between the AAs; and the structures of the two parts are different. Such a structure prevents the electrification of the word line (WL) between the adjacent AAs in a same direction from affecting the adjoining AAs, thereby weakening the influence of the row hammer effect.

The technical solutions of the present disclosure are described in detail below with reference to specific application scenarios and FIG. 4a to FIG. 7c.

Figure 4A:
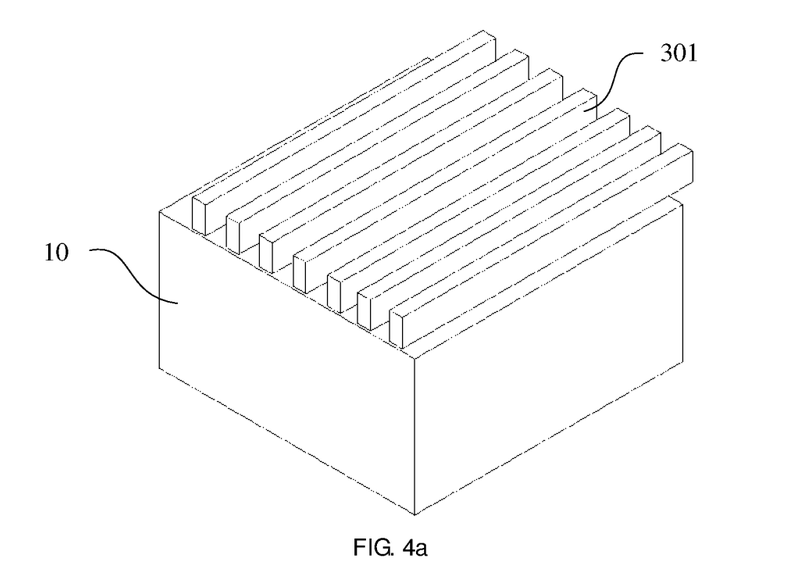
FIGS. 4a and 4b are schematic diagrams of a process of forming a word line structure in a method of manufacturing a semiconductor structure according to embodiments of the present disclosure.

In some embodiments, in step S1, the etching the semiconductor substrate to form initial word line trenches may specifically include:

step S11, with reference to FIG. 4a, deposit a first word line mask 301 on the semiconductor substrate 10. As shown in FIG. 4a, the semiconductor substrate 10 may be an Si substrate, and the first word line mask 301 is strip-shaped mask pattern on the Si substrate and may be photoresist; and step S12, etch the semiconductor substrate 10 by taking the first word line mask 301 as a mask to form initial word line trenches, the initial word line trenches extending along a direction parallel to a surface of the semiconductor substrate.

In some embodiments, in step S1, before the forming a first word line conductive layer in the initial word line trenches, the method further includes:

step S13, deposit a gate oxide layer, the gate oxide layer covering bottom surfaces and side walls of the initial word line trenches; and step S14, deposit a barrier layer, the barrier layer covering the bottom surface and side walls of the gate oxide layer.

In the embodiments of the present disclosure, the gate oxide layer may be made of an oxide material, such as SiO. The barrier layer may be made of an insulating material.

Figure 4B:
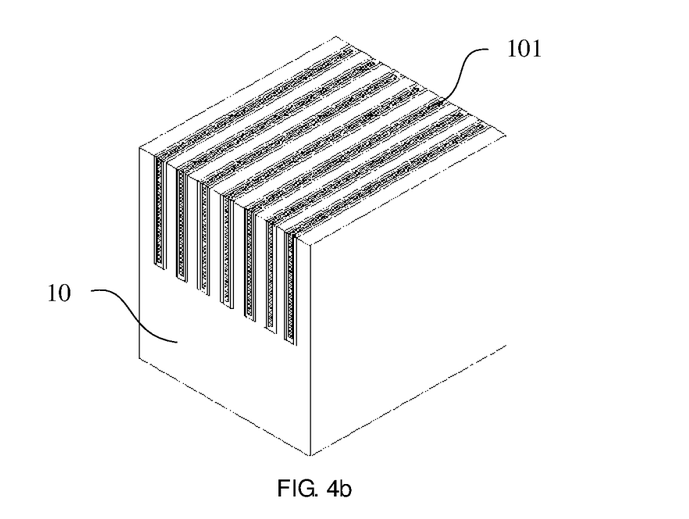

In some embodiments, in step S1, the forming a first word line conductive layer in the initial word line trenches may specifically include:

step S15, deposit a first word line conductive material layer, the first word line conductive material layer being filled in the initial word line trenches and covering an upper surface of the semiconductor substrate 10; and step S16, with reference to FIG. 4b, planarize the first word line conductive material layer to form the first word line conductive layer 101, the upper surface of the first word line conductive layer 101 being flush with the upper surface of the semiconductor substrate 10. After step S1 is completed, the form of the word line structure is as shown in FIG. 4b.

In the embodiments of the present disclosure, the first word line conductive layer 101 may be made of a metal or a metal compound, and may be, for example, a metal of W or TiN or a combination of the two.

Figure 5A:
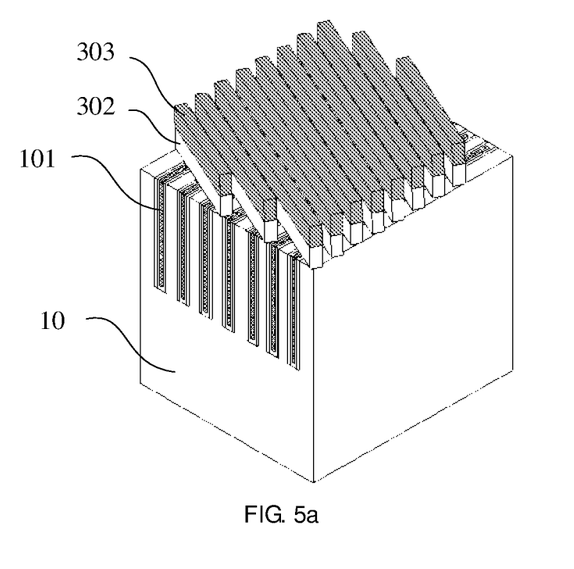
FIGS. 5a to 5c are schematic diagrams of a process of forming an island-shaped SiN mask in a method of manufacturing a semiconductor structure according to embodiments of the present disclosure.

In some embodiments, in step S2, the downwards etching the semiconductor substrate and the first word line conductive layer, and forming a plurality of columnar basal bodies may specifically include:

step S21, as shown in FIG. 5a, deposit a linear mask 302 on the semiconductor substrate 10, the linear mask 302 being made of SiN.

Figure 5B:
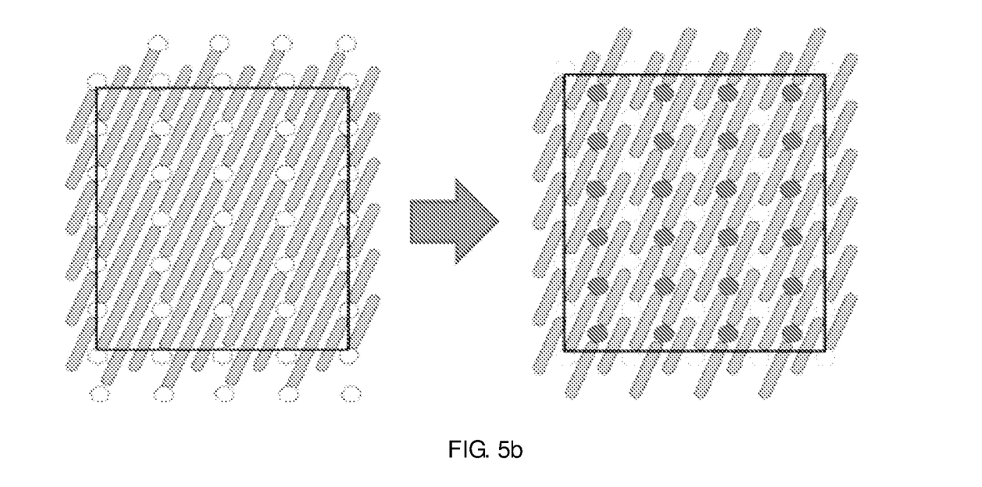
Figure 5C:
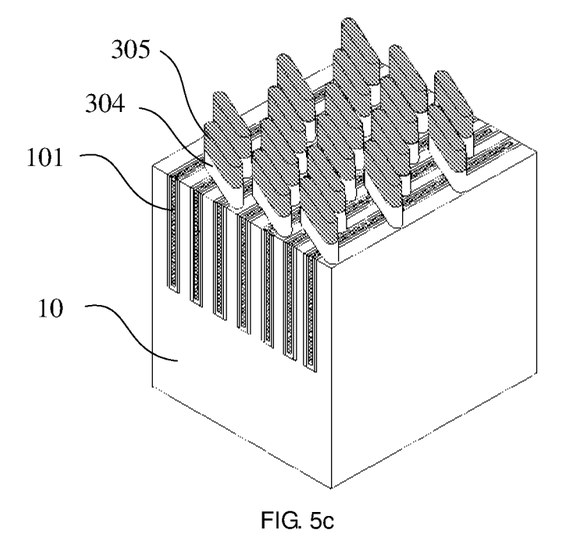

Step S22, with reference to FIG. 5a and FIG. 5c, partially etch the linear mask 302 to form the island-shaped mask 304.

In the embodiments of the present disclosure, the partially etching the linear mask 302 may specifically include:

step S221, as shown in FIG. 5a, form a first mask 303 on the linear mask 302, the first mask 303 being photoresist;

step S222, as shown in FIG. 5a, FIG. 5b, and FIG. 5c, cut off the first mask 303 to form a second mask 305; and step S223, as shown in FIG. 5c, partially etch the linear mask 302 on the basis of the second mask 305 to form the island-shaped mask 304.

Figure 6A:
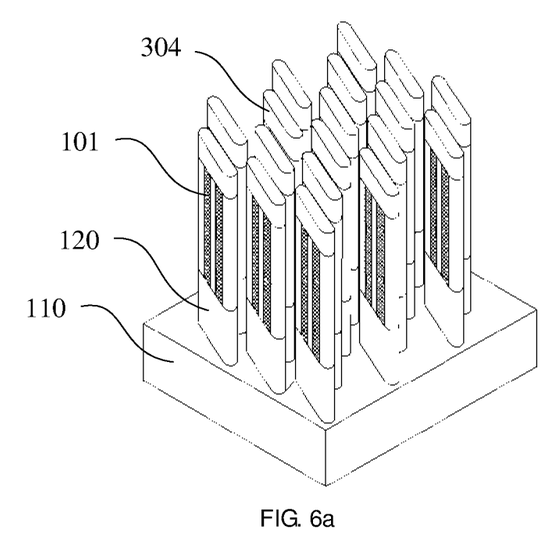
FIGS. 6a to 6c are schematic diagrams of a process of forming a columnar active area in a method of manufacturing a semiconductor structure according to embodiments of the present disclosure.

Step S23, as shown in FIG. 5c and FIG. 6a, etch the semiconductor substrate 10 and the first word line conductive layer 101 by taking the island-shaped mask 304 as a mask to form columnar basal bodies 120. Remaining parts after the semiconductor substrate 10 is etched form the substrate layer 110 and the columnar basal bodies 120. At this time, the parts of the first word line conductive layer 101 intersecting with the columnar basal bodies 120 are retained, and the rest parts are etched.

Figure 6B:
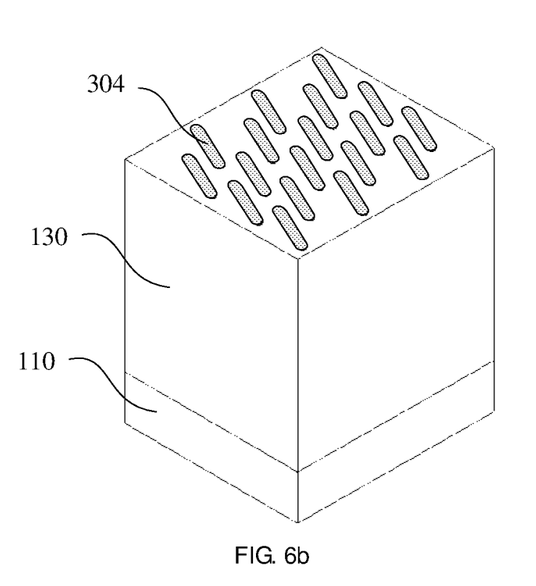

With reference to FIG. 6b, in some embodiments, step S3 of filling an isolation layer around the columnar basal bodies may specifically include:

step S31, fill an isolation material layer around the columnar basal bodies, the isolation material layer covering an upper surfaces of the island-shaped mask; and step S32, planarize the isolation material layer to form an isolation layer 130, an upper surface of the isolation layer 130 being flush with the upper surface of the island-shaped mask 304. In the embodiments of the present disclosure, the isolation layer 130 may be made of an oxide material, such as SiO.

With reference to FIG. 6b, after step S3 is completed, the island-shaped mask 304 is retained for protecting the first word line conductive layer 101. The planarization operation specifically employs chemical mechanical polishing (CMP) to flatten a surface layer.

Figure 6C:
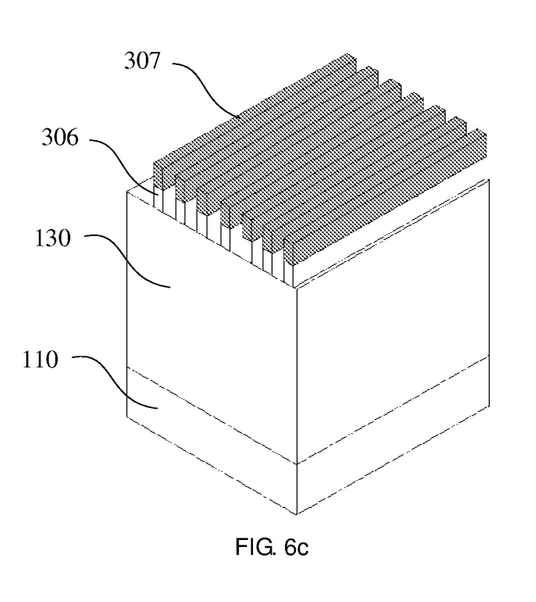

In some embodiments, in step S4, the etching the first word line conductive layer and the isolation layer to form second trench portions in the isolation layer specifically includes:

step S41, as shown in FIG. 6a and FIG. 6c, form a second word line mask 306 on a surface of the first word line conductive layer 101 and a surface of the isolation layer 130, projection of the second word line mask 306 and projection of the first word line mask 301 on the semiconductor substrate 10 overlapping.

In the embodiments of the present disclosure, the second word line mask 306 is made of SiN. With reference to FIG. 5c and FIG. 6c, the forming a second word line mask 306 may include: first deposit a layer of SiN material on the upper surface of the semiconductor substrate 10, and then deposit a layer of photoresist; then pattern the layer of photoresist to form the third mask 307; and finally, etch the layer of SiN material on the basis of the third mask 307 to form the second word line mask 306.

Figure 7A:
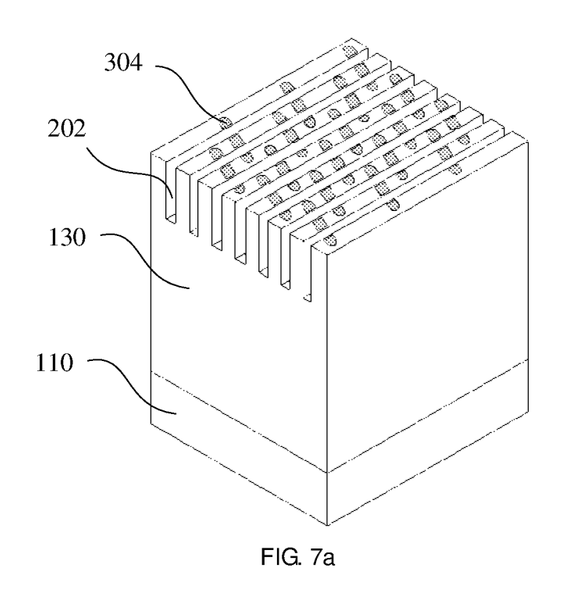
FIGS. 7a to 7c are schematic diagrams of a process of forming a polysilicon layer and an insulating layer in a method of manufacturing a semiconductor structure according to embodiments of the present disclosure.

Step S42, as shown in FIG. 6c and FIG. 7a, etch the isolation layer 130 by taking the second word line mask 306 as a mask to form second trench portions 202 in the isolation layer 130. With reference to FIG. 2c, the depth of etching the isolation layer 130 this time is D4.

Step S43, as shown in FIG. 2c, FIG. 6c, and FIG. 7a, etch the first word line conductive layer 101 by taking the second word line mask 306 as a mask to expose parts of the first trench portions 201. With reference to FIG. 2c, the depth of etching the first word line conductive layer 101 this time is D3. That is, the depths D3 of the exposed parts of the first trench portions 201 are greater than the depths D4 of the second trench portions 202.

Figure 7B:
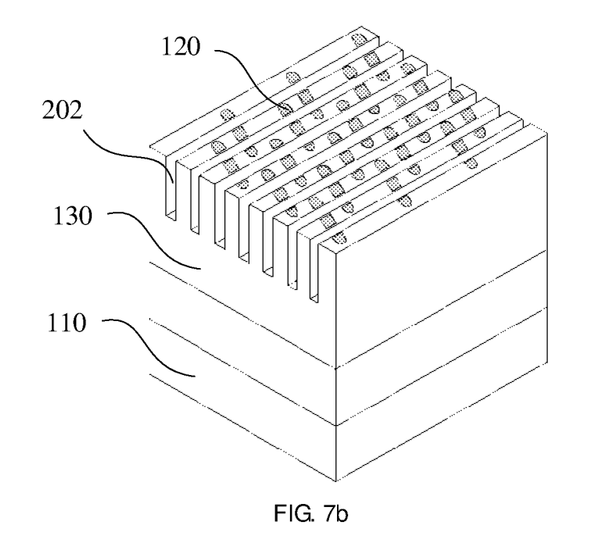

In some embodiments, in step S4, after etching the first word line conductive layer and the isolation layer to form second trench portions in the isolation layer, the method further includes:

step S44, as shown in FIG. 7a and FIG. 7b, remove the island-shaped mask 304 and parts of the isolation layer 130, such that an upper surface of the remaining part of the isolation layer 130 is flush with the upper surfaces of the columnar basal bodies 120.

Figure 7C:
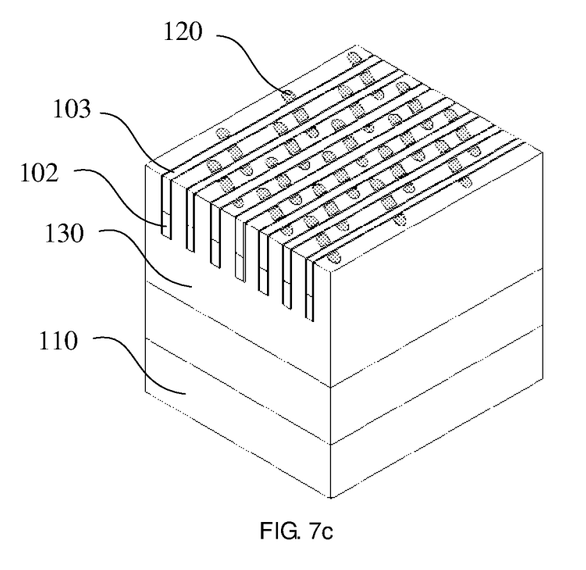

As shown in FIG. 2b, FIG. 2c, FIG. 6c, and FIG. 7c, in some embodiments, in step S5, the depositing a second word line conductive layer and an insulating layer in the word line trenches may specifically include:

step S51, remove the second word line mask 306;

step S52, deposit the second word line conductive layer 102 in the second trench portions 202 and the exposed parts of the first trench portions 201. With reference to FIG. 2b, the upper surface of the second word line conductive layer 102 is lower than the upper surfaces of the columnar basal bodies 120. Because D3 is greater than D4 in step S4 (that is, the bottoms of the second trench portions 202 are higher than the bottoms of the exposed parts of the first trench portions 201), the bottom surface of the second word line conductive layer 102 located at the first trench portions 201 is lower than the bottom surface of the second word line conductive layer 102 located at the second trench portions 202; and step S53, deposit an insulating layer 103 on the second word line conductive layer 102, an upper surface of the insulating layer 103 being flush with the upper surfaces of the columnar basal bodies 120. In the embodiments of the present disclosure, the second word line conductive layer 102 may be made of polysilicon (Poly), and the insulating layer 103 may be made of SiN.

It should be noted that in the embodiments of the present disclosure, the Si/Poly/SiO/SiN etching gas may be $SF_6$/$CF_4$/$Cl_2$/$CHF_3$/$O_2$/Ar or a mixed gas to achieve a certain selection ratio.

SiN side wall deposition may be an atomic layer deposition (ALD) technology, and the ALD reaction gas may be $NH_3$ or an $N_2$/$H_2$ mixed reaction gas.

The SiN covering layers may adopt LPCVD, and the reaction gas may be $SiH_4$ or $SiH_2Cl_2$. LPCVD is low pressure chemical vapor deposition high temperature oxidation.

SiO deposition may be ALD SiO deposition, and the reaction gas may be LTO520/$O_2$ or N zero/$O_2$.

According to the semiconductor structure manufactured by the method of the present disclosure, the finally formed BWL includes two parts: the word line located in the AAs, and the PWL of the isolation layer located between the AAs; and the structures of the two parts are different. Such a structure prevents the electrification of the word line (WL) between the adjacent AAs in a same direction from affecting the adjoining AAs, thereby weakening the influence of the row hammer effect. Moreover, the upper-layer part (the second word line conductive layer 102) of the word line has dual gate poly, which avoids the interference caused by the PWL, and reduces the GIDL.

The embodiments of the present disclosure further provide a memory, including the semiconductor structure described above. In the semiconductor structure, the first word line conductive layer 101 only exists in the AAs (the columnar basal bodies 120), but not in the isolation layer 130. The first word line conductive layer 101 in different AAs is connected through the second word line conductive layer 102. Such a structure separates the adjacent memory cells by the filled isolation layer 130, such that it is difficult for the electrons to migrate from one memory cell to the adjacent memory cells, thereby weakening the row hammer effect caused by the electron migration.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

According to the method of manufacturing a semiconductor structure, the semiconductor structure, and the memory provided in the embodiments of the present disclosure, the buried word line is divided into two parts. The first word line conductive layer only exists in the columnar basal bodies (e.g., active areas), but not in the isolation layer. The first word line conductive layer in different active areas is connected through the second word line conductive layer. Such a structure separates adjacent memory cells by the filled isolation layer, such that it is difficult for electrons to migrate from one memory cell to an adjacent memory cell, thereby weakening the row hammer effect caused by electron migration.

The invention claimed is:

1. A semiconductor structure, comprising: a base comprising columnar basal bodies and an isolation layer filled around the columnar basal bodies, wherein
    word line trenches are provided in the base and extend along a direction parallel to a surface of the base;
    first trench portions are formed at parts of the word line trenches intersecting with the columnar basal bodies, and a first word line conductive layer, a second word line conductive layer, and an insulating layer are sequentially arranged in the first trench portions from bottom to top; and
    second trench portions are formed at parts of the word line trenches intersecting with the isolation layer, and the second word line conductive layer and the insulating layer are sequentially arranged in the second trench portions from bottom to top.

2. The semiconductor structure according to claim 1, wherein the first trench portions are deeper than the second trench portions.

3. The semiconductor structure according to claim 2, wherein a top end surface of the first word line conductive layer in the first trench portions is lower than bottom end surfaces of the second trench portions.

4. The semiconductor structure according to claim 1, wherein the columnar basal bodies are made of silicon; and the isolation layer is made of silicon oxide.

5. The semiconductor structure according to claim 1, wherein the first word line conductive layer is made of one of titanium nitride and tungsten or a combination of the two; the second word line conductive layer is made of doped polysilicon; and the insulating layer is made of silicon nitride.

6. A memory, comprising the semiconductor structure according to claim 1.

7. A method of manufacturing a semiconductor structure, comprising:
    etching a semiconductor substrate to form initial word line trenches, and forming a first word line conductive layer in the initial word line trenches;
    downwards etching the semiconductor substrate and the first word line conductive layer, and forming a plurality of columnar basal bodies, the columnar basal bodies being deeper than the first word line conductive layer, and retained parts of the initial word line trenches in the columnar basal bodies being first trench portions;
    filling an isolation layer around the columnar basal bodies;
    etching the first word line conductive layer and the isolation layer to form second trench portions in the isolation layer, wherein the first trench portions are communicated with the second trench portions to form word line trenches, and bottoms of the second trench portions are higher than bottoms of the first trench portions; and
    depositing a second word line conductive layer and an insulating layer in the word line trenches.

8. The method according to claim 7, wherein the etching a semiconductor substrate to form initial word line trenches comprises:
    depositing a first word line mask on the semiconductor substrate; and
    etching the semiconductor substrate by taking the first word line mask as a mask to form the initial word line trenches, the initial word line trenches extending along a direction parallel to a surface of the semiconductor substrate.

9. The method according to claim 8, before the forming a first word line conductive layer in the initial word line trenches, the method further comprises:
    depositing a gate oxide layer, the gate oxide layer covering bottom surfaces and side walls of the initial word line trenches; and
    depositing a barrier layer, the barrier layer covering a bottom surface and side walls of the gate oxide layer.

10. The method according to claim 8, wherein the forming a first word line conductive layer in the initial word line trenches comprises:
    depositing a first word line conductive material layer, the first word line conductive material layer being filled in the initial word line trenches and covering an upper surface of the semiconductor substrate; and
    planarizing the first word line conductive material layer to form the first word line conductive layer, an upper surface of the first word line conductive layer being flush with the upper surface of the semiconductor substrate.

11. The method according to claim 7, wherein the downwards etching the semiconductor substrate and the first word line conductive layer, and forming a plurality of columnar basal bodies comprises:

depositing a linear mask on the semiconductor substrate;
partially etching the linear mask to form an island-shaped mask; and
etching the semiconductor substrate and the first word line conductive layer by taking the island-shaped mask as a mask to form the columnar basal bodies.

12. The method according to claim 11, wherein the filling an isolation layer around the columnar basal bodies comprises:

filling an isolation material layer around the columnar basal bodies, the isolation material layer covering an upper surface of the island-shaped mask; and
planarizing the isolation material layer to form the isolation layer, an upper surface of the isolation layer being flush with the upper surface of the island-shaped mask.

13. The method according to claim 12, wherein the etching the first word line conductive layer and the isolation layer to form second trench portions in the isolation layer comprises:

forming a second word line mask on a surface of the first word line conductive layer and a surface of the isolation layer, projection of the second word line mask and projection of a first word line mask on the semiconductor substrate overlapping;
etching the isolation layer by taking the second word line mask as a mask to form the second trench portions in the isolation layer; and
etching the first word line conductive layer by taking the second word line mask as a mask to expose parts of the first trench portions, exposed parts of the first trench portions being deeper than the second trench portions.

14. The method according to claim 13, after the etching the first word line conductive layer and the isolation layer to form the second trench portions in the isolation layer, the method further comprises:

removing the island-shaped mask and parts of the isolation layer, such that an upper surface of a remaining part of the isolation layer is flush with upper surfaces of the columnar basal bodies.

15. The method according to claim 13, wherein the depositing a second word line conductive layer and an insulating layer in the word line trenches comprises:

removing the second word line mask;
depositing the second word line conductive layer in the second trench portions and the exposed parts of the first trench portions, an upper surface of the second word line conductive layer being lower than upper surfaces of the columnar basal bodies, and a bottom surface of the second word line conductive layer located at the first trench portions being lower than a bottom surface of the second word line conductive layer located at the second trench portions; and
depositing the insulating layer on the second word line conductive layer, an upper surface of the insulating layer being flush with the upper surfaces of the columnar basal bodies.

* * * * *